United States Patent
Hashimoto

(10) Patent No.: US 7,482,271 B2
(45) Date of Patent: Jan. 27, 2009

(54) MANUFACTURING METHOD FOR ELECTRONIC SUBSTRATE, MANUFACTURING METHOD FOR ELECTRO-OPTICAL DEVICE, AND MANUFACTURING METHOD FOR ELECTRONIC DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 203 days.

(21) Appl. No.: 11/488,859

(22) Filed: Jul. 18, 2006

(65) Prior Publication Data

US 2007/0020927 A1  Jan. 25, 2007

(30) Foreign Application Priority Data

Jul. 20, 2005 (JP) ............... 2005-210057

(51) Int. Cl.
 *H01L 21/44* (2006.01)
(52) U.S. Cl. ............... 438/669; 438/670; 257/E21.025; 257/E21.038
(58) Field of Classification Search ................. 438/669, 438/670, 671, 951, 950; 257/E21.025, E21.027, 257/E21.038, E21.046
 See application file for complete search history.

(56) References Cited

U.S. PATENT DOCUMENTS

| | | | |
|---|---|---|---|
| 3,296,574 A | 1/1967 | Tassara | |
| 4,313,995 A * | 2/1982 | Delgadillo | ................. 428/201 |
| 4,804,434 A | 2/1989 | von Kraewel | |
| 4,878,770 A | 11/1989 | Ruggierio et al. | |
| 5,038,132 A | 8/1991 | Lindblom et al. | |
| 5,043,295 A | 8/1991 | Ruggerio et al. | |
| 5,328,546 A | 7/1994 | Brady et al. | ................. 156/584 |
| 5,759,422 A * | 6/1998 | Schmelzer et al. | ............ 216/35 |
| 5,800,724 A * | 9/1998 | Habeger et al. | ................. 216/35 |
| 6,193,911 B1 | 2/2001 | Hunt et al. | ................. 252/518.1 |
| 2007/0149001 A1* | 6/2007 | Uka | ................. 439/67 |

FOREIGN PATENT DOCUMENTS

| | | |
|---|---|---|
| EP | 0 330 210 | 8/1989 |
| EP | 0 540 820 | 5/1993 |
| EP | 1 477 841 A1 | 11/2004 |
| JP | 58-007848 | 1/1983 |
| JP | H03-502147 | 5/1991 |
| JP | 2001-250877 | 9/2001 |
| JP | 2003-046026 | 2/2003 |
| JP | 2003-89189 | 3/2003 |
| JP | 2003-243794 | 8/2003 |
| JP | 2004-63722 | 2/2004 |
| JP | 2005-116927 | 4/2005 |

OTHER PUBLICATIONS

Communication from European Patent Office regarding counterpart application. Dec. 1, 2006.

* cited by examiner

*Primary Examiner*—Caridad M Everhart
(74) *Attorney, Agent, or Firm*—Harness, Dickey & Pierce, P.L.C.

(57) ABSTRACT

A manufacturing method for an electronic substrate, includes: preparing a substrate and a mask having a predetermined region; forming a wiring pattern on the substrate; forming an aperture portion in the predetermined region of the mask; affixing the mask on the substrate; and removing at least a part of the wiring pattern through the aperture portion of the mask thereby forming the electronic element on the substrate.

19 Claims, 9 Drawing Sheets

MANUFACTURING METHOD FOR ELECTRONIC SUBSTRATE, MANUFACTURING METHOD FOR ELECTRO-OPTICAL DEVICE, AND MANUFACTURING METHOD FOR ELECTRONIC DEVICE

CROSS-REFERENCE TO RELATED APPLICATION

This application claims priority from Japanese Patent Application No. 2005-210057, filed Jul. 20, 2005, the contents of which are incorporated herein by reference.

BACKGROUND

1. Technical Field

This invention relates to a manufacturing method for an electronic substrate, a manufacturing method for an electro-optical device, and a manufacturing method for an electronic device.

2. Related Art

In recent years, as electronic device becomes more compact and requires more sophisticated functions, semiconductor devices with more compact packages, or which can be packaged at higher densities, have been sought.

As one example, technology is known in which poly-silicon is used to incorporate resistances onto semiconductor elements.

For example, in Japanese Unexamined Patent Application, First Publication No. S58-7848, technology is disclosed to form a resistance using polycrystalline grain boundaries obtained by doping poly-silicon with impurities.

In addition, in Japanese Unexamined Patent Application, First Publication No. 2003-46026, technology is disclosed to form resistance portions in the relocated wiring portion of semiconductor elements by applying and hardening a resistive paste using a thick film formation method.

However, the above-described technologies of the prior art have the following problems.

When using resistances and other passive elements provided on a substrate for impedance control or the like, the resistance values must be managed with high precision.

It is difficult to secure the required precision using the above-described technologies, and there has been the problem in that highly reliable resistance portions cannot be obtained.

Hence in the prior art, often a method has been used of forming an aperture portion corresponding to a passive element in a mask, by using photolithography or another photo-process, as a forming method for the above passive elements and similar with comparatively high precision.

However, because photo-processes require a development process and similar, there is the problem that manufacturing costs are increased.

SUMMARY

An advantage of some aspects of the invention is to provide a manufacturing method for an electronic substrate, a manufacturing method for an electro-optical device, and a manufacturing method for electronic device which form highly precise electronic elements, while suppressing manufacturing costs.

A first aspect of the invention provides manufacturing method for an electronic substrate, including: preparing a substrate and a mask having a predetermined region; forming a wiring pattern on the substrate; forming an aperture portion in the predetermined region of the mask; affixing the mask on the substrate; and removing at least a part of the wiring pattern through the aperture portion of the mask thereby forming the electronic element on the substrate.

Hence in a manufacturing method for an electronic substrate of this invention, by affixing, on the substrate, the mask on which the aperture portion corresponding to an electronic element is formed, and using etching or the like to pattern a portion of the wiring pattern exposed from the aperture portion, an electronic element can be formed on the substrate with high precision, according to the position and shape of the aperture portion.

In this way, by means of this invention a high-precision electronic element can be formed at low cost, without requiring photo-processes.

It is preferable that, in the manufacturing method for an electronic substrate of this invention, the forming of the aperture portion include die-cutting the mask.

Using this procedure, the aperture portion can be formed easily and with high precision.

Furthermore, masks with the aperture portion formed with the same precision can be formed in large quantities at low cost.

It is preferable that, in the manufacturing method for an electronic substrate of this invention, the mask have a first film member that is to be affixed to the substrate, and a second film member that is peelably laminated on the first film member.

It is preferable that, in the manufacturing method for an electronic substrate of this invention, the first film member be formed to a size according to the size of the substrate, the second film member be formed into a strip shape, and a plurality of the first film members be laminated onto the second film member in the direction of extension of the strip-shaped second film member.

It is preferable that, in the manufacturing method for an electronic substrate of this invention, the affixing of the mask be performed affixing in order the first film members on the substrate, while intermittently moving the second film member in the direction of extension of the strip-shaped second film member.

Thus in this invention, by affixing in order the first film members on the substrate while feeding intermittently in the direction of extension of the strip-shaped second film member, masks can be formed intermittently on a plurality of substrates, so that productivity can be improved.

It is preferable that, in the manufacturing method for an electronic substrate of this invention, the affixing of the mask be performed affixing the mask on the substrate in a negative-pressure environment.

It is preferable that, in the manufacturing method for an electronic substrate of this invention, the affixing of the mask be performed affixing the mask on the substrate while heating the mask and pressuring the mask into the substrate.

By this means, the intrusion of air bubbles between the mask and the substrate can be prevented, and degraded quality of electronic elements arising from air bubbles can be prevented.

It is preferable that the manufacturing method for an electronic substrate of this invention further include: sealing the electronic element by a sealing member.

By this means, in this invention the electronic element can be protected, and corrosion and short-circuitting can be prevented.

It is preferable that, in the manufacturing method for an electronic substrate of this invention, the removing of at least a part the wiring pattern be performed removing a portion of the wiring pattern of the substrate thereby forming a resistance element as the electronic element.

It is preferable that, in the manufacturing method for an electronic substrate of this invention, the wiring pattern of the substrate have wiring layers which are at least two layers, and a number of layers of the resistance element be fewer than that of the wiring layers of the wiring pattern.

By this means, in this invention, a resistance element can easily be formed.

It is preferable that, in the manufacturing method for an electronic substrate of this invention, the forming of the wiring pattern include: forming a first wiring pattern on the substrate; and forming a second wiring pattern layered on top of the first wiring pattern and made of a material differed from that of the first wiring pattern, and a portion of the second wiring pattern be removed through the aperture portion of the mask.

By this means, in this invention, by for example using etching or the like to remove a portion of the second wiring pattern, locally a portion of the wiring pattern includes the first wiring pattern, so that a resistance element having higher resistance than other elements can be formed as an electronic element.

Furthermore, when etching treatment or the like is used to remove the second wiring pattern, by selecting the etching gasses or etching gasses or etching solutions removing the second wiring pattern, only the second wiring pattern can easily be removed.

It is preferable that, in the manufacturing method for an electronic substrate of this invention, a resistance value of the material of the first wiring pattern be larger than that of the second wiring pattern.

By this means, in this invention, a resistance element with a high resistance value can easily be formed.

It is preferable that, in the manufacturing method for an electronic substrate of this invention, the substrate include a semiconductor element.

By this means, in this invention an electronic element can be formed alongside of a semiconductor element, so that the path between the semiconductor element and the electronic element can be shortened, and wiring can be made extremely small.

In this case, as the semiconductor element, a configuration in which a transistor or other switch element is formed by means of a wiring pattern formed in an active region, or a configuration in which a semiconductor chip incorporating a semiconductor element is packaged on an active region, can be adopted.

It is preferable that, in the manufacturing method for an electronic substrate of this invention, no semiconductor element be packaged on the substrate.

Application is possible, even if in a state on which a semiconductor element is not packaged, that is, a semiconductor element is not formed, in for example a state on which a semiconductor element is not packaged on a silicon substrate.

It is preferable that the manufacturing method for an electronic substrate of this invention further include: forming an insulating film on which the wiring pattern is formed, formed on the substrate.

It is preferable that the manufacturing method for an electronic substrate of this invention further include: forming an electrode portion; and connecting the electrode portion with the wiring pattern.

It is preferable that, in the manufacturing method for an electronic substrate of this invention, at least a portion of the wiring pattern have a connection terminal.

It is preferable that the manufacturing method for an electronic substrate of this invention further include: forming an electrode portion connected with the wiring pattern, and the wiring pattern include a terminal at which at least a portion of the wiring pattern is connected to an external terminal.

As a configuration in which the wiring pattern is connected to an electrode portion, and at least one portion is connected to an external terminal, for example a W-CSP (Wafer-Level Chip-Size Package) package may be adopted.

A second aspect of the invention provides manufacturing method for an electro-optical device in which the electronic substrate is packaged, including: manufacturing the electronic substrate by the above described manufacturing method for an electronic substrate.

A third aspect of the invention provides manufacturing method for an electronic device in which the electronic substrate is packaged, including: manufacturing the electronic substrate by the above described manufacturing method for an electronic substrate.

Hence by means of this invention, a high-quality electro-optical device and electronic device having a high-precision electronic element can be obtained at low cost. Moreover, electro-optical devices and electronic devices can be manufactured efficiently.

DESCRIPTION OF EXEMPLARY EMBODIMENTS

Below, embodiments of an electronic substrate, a manufacturing method for an electronic substrate, and a manufacturing method for electronic device of this invention are explained, referring to FIGS. 1 to 11.

Electro-Optical Device

Figure 1:
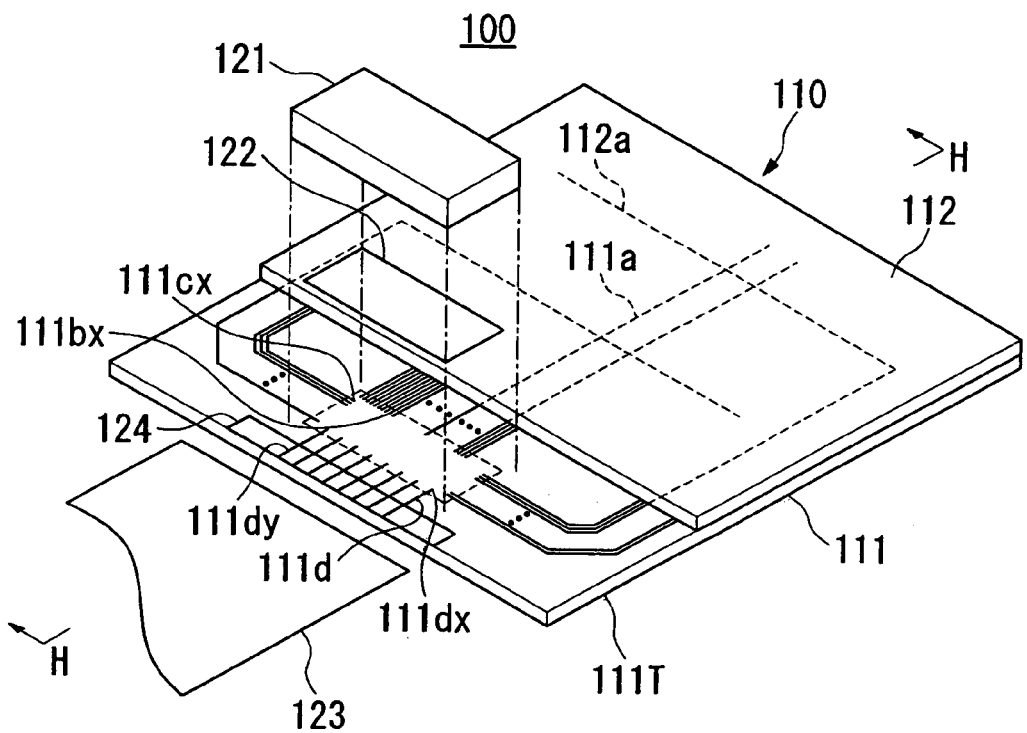
FIG. 1 is a perspective schematic diagram showing a liquid crystal display device which is an embodiment of an electro-optical device.

FIG. 1 is a perspective schematic diagram showing a liquid crystal display device which is an embodiment of an electro-optical device.

The liquid crystal display device 100 shown in FIG. 1 has a liquid crystal panel 110 and a semiconductor device 121.

In addition, polarizing plates, reflective sheets, a backlight, and other additional members are provided as necessary or appropriate.

The liquid crystal panel 110 includes a substrate 111 and a substrate 112, made of glass, plastic, or the like.

The substrate 111 and the substrate 112 are positioned in mutual facing and laminated together using sealing member or the like.

Liquid crystals, which are electro-optical material, are sealed between the substrate 111 and the substrate 112.

Electrodes 111a, formed from ITO (Indium Tin Oxide) or another transparent conductor, are formed on the inside face of the substrate 111.

Electrodes 112a are formed on the inner face of the substrate 112, positioned to face the electrodes 111a.

The electrodes 111a and the electrodes 112a are perpendicularly positioned.

The electrodes 111a and the electrodes 112a are drawn out to a substrate extended portion 111T, and at the end portions thereof, electrode terminals 111bx and electrode terminals 111cx are respectively formed.

Also, input wirings 111d are formed in the vicinity of an edge of the substrate extended portion 111T.

Terminals 111dx are formed on the inner end portion of the input wirings 111d.

The semiconductor device 121 is packaged on the substrate extended portion 111T, with sealing resin 122 intervening.

The semiconductor device 121 is for example a liquid crystal driving IC chip to drive the liquid crystal panel 110.

Numerous bump electrodes are formed on the bottom face (the face facing the substrate extended portion 11T) of the semiconductor device 121.

The bump electrodes are electrically and conductively connected with the terminals 111bx, 111cx, and 111dx on the substrate extended portion 111T.

Furthermore, input terminals 111dy are formed on the outer end of the input wiring 111d.

A flexible wiring substrate 123 is packaged on the input terminals 111dy, via an anisotropic conductive film 124.

The input terminals 111dy are electrically and conductively connected with the wiring formed on the flexible wiring substrate 123.

By supplying control signals, image signals, power supply potentials and the like to the input terminals 111dy from outside via the flexible wiring substrate 123, driving signals to drive the liquid crystals are generated in the semiconductor device 121 and are supplied to the liquid crystal panel 110.

In a liquid crystal display device 100 of this embodiment, configured as described above, appropriate voltages are applied across the electrodes 111a and 112a via the semiconductor device 121.

By this means, liquid crystals are reoriented, and light can be modulated, in each of the pixels in which the electrodes 111a and 112a are faced.

By this means, pixels within the liquid crystal panel 110 can form a desired image in the display area in which pixels are arranged.

Figure 2:
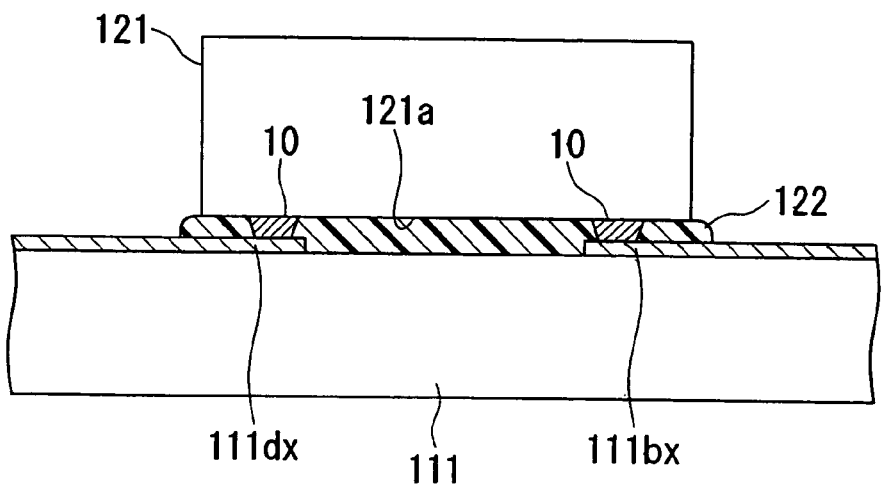
FIG. 2 is a cross-sectional view explaining the packaged structure of a semiconductor device in a liquid crystal display device.

FIG. 2 is a side cross-sectional view taken along the line H-H in FIG. 1, and explains the packaged structure of the semiconductor device 121 in the above liquid crystal display device 100.

As shown in FIG. 2, a plurality of bump electrodes 10, which are terminals on the IC chip side, are formed as connection terminals on the active face 121a of the semiconductor device 121.

The tips of the bump electrodes 10 are electrically and conductively connected directly to the terminals 111bx and 111dx of the substrate 111.

The surroundings of the conductive contact portions of the bump electrodes 10 and the terminals 111bx and 111dx are filled with a hardened sealing resin 122 made of a thermocurable resin or the like.

Semiconductor Device

Next, the terminal structure of the semiconductor device 121 as the electronic substrate of the first embodiment is explained.

Figure 3:
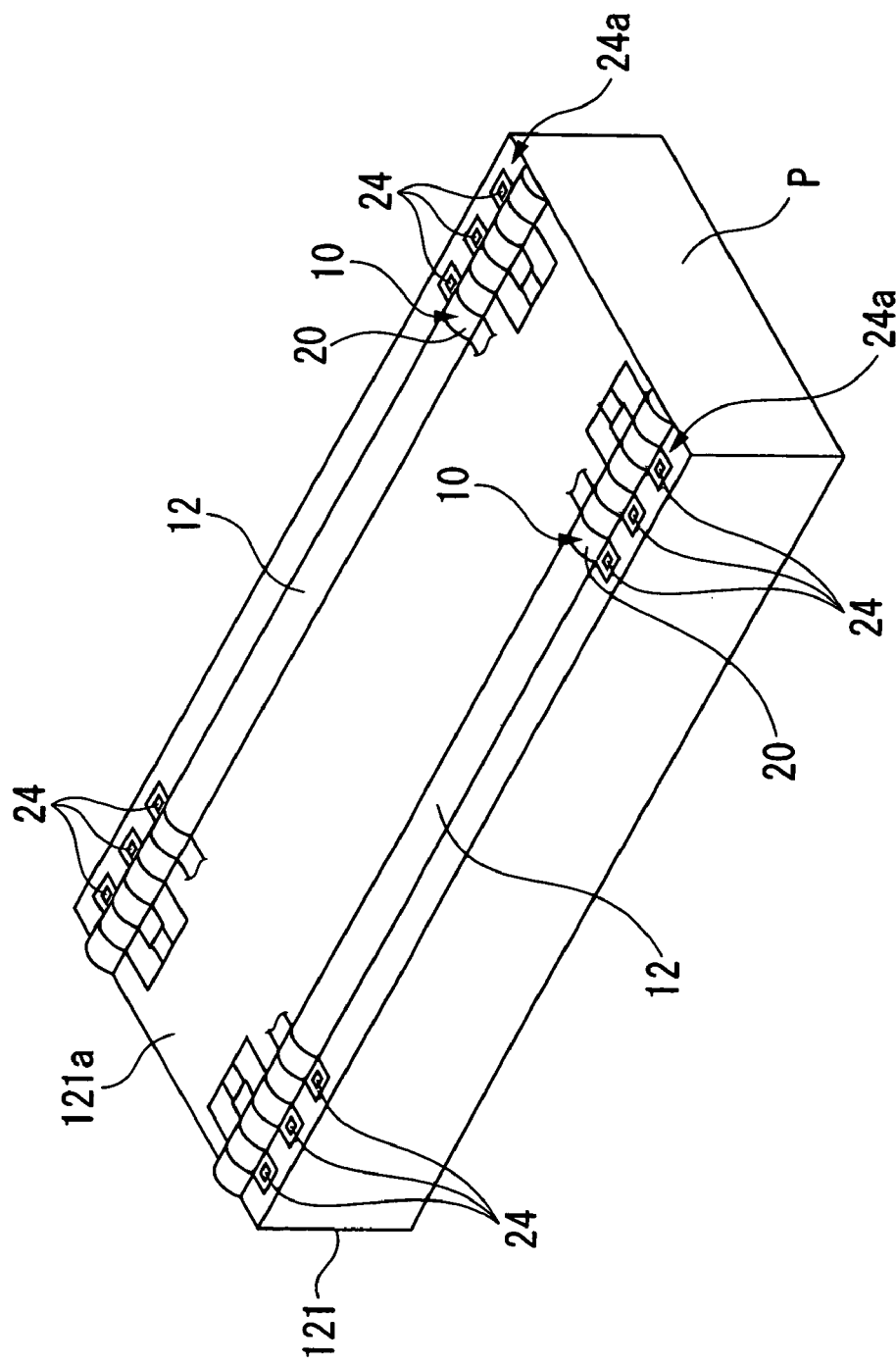
FIG. 3 is a perspective view of a semiconductor device.

FIG. 3 is a perspective partial view showing the structure on the active face 121a of the semiconductor device 121 on which terminals are formed.

The semiconductor device 121 is for example an IC chip which drives the pixels of a liquid crystal display device.

Electronic circuits (integrated circuits) having a plurality of thin film transistors, other electronic devices as well as wiring affixing the elements, and other semiconductor elements are formed on the active face 121a of the semiconductor device 121.

In the semiconductor device 121 as shown in FIG. 3, a plurality of electrode pads 24 (electrode portions) is arranged along the long edge of the active face 121a of the substrate P.

These electrode pads 24 are drawn out from the above electronic elements and the like, and function as external electrodes of the electronic circuit.

In the active face 121a, resin protrusions 12 are formed continuously in straight line shapes along the electrode pad rows 24a on the inside of the position at which the electrode pad rows 24a are formed.

Thus, the resin protrusions 12 are formed along the long edges of the active face 121a of the substrate P.

Moreover, a plurality of conductive films 20 is formed, as wiring patterns (metal wires) affixing the electrode pads 24 with the tops of the resin protrusions 12, from the surfaces of each of the electrode pads 24 to the surfaces of the resin protrusions 12.

Bump electrodes 10 are formed on the active face 121a of the substrate P. The Bump electrodes 10 include the resin protrusions 12 as the core together with the conductive films 20 placed on the surfaces of the resin protrusions 12.

In the example of FIG. 3, the resin protrusions 12 are formed on the inside of the positions at which the electrode pad rows 24a are formed on the active face 121a. Not only above described structure but also the resin protrusions 12 may be formed on the outside of the positions of formation of the electrode pad rows 24a.

Figure 4A:
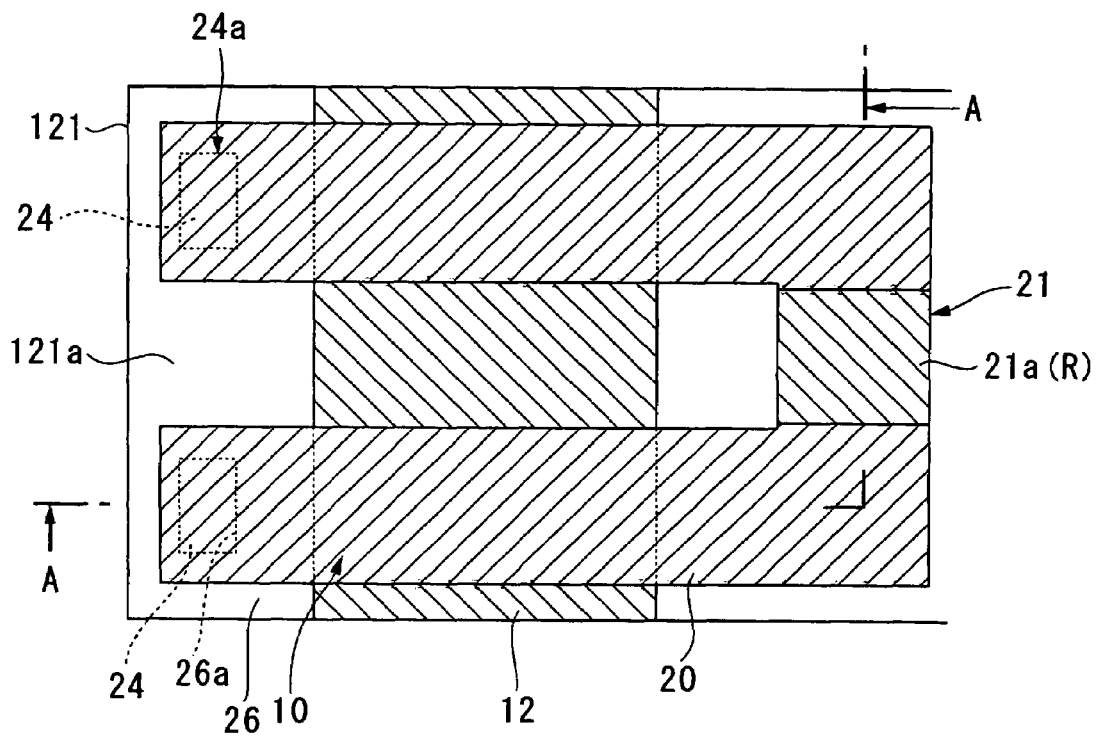
FIG. 4A is an enlarged plan view showing a terminal portion of a semiconductor device.
Figure 4B:
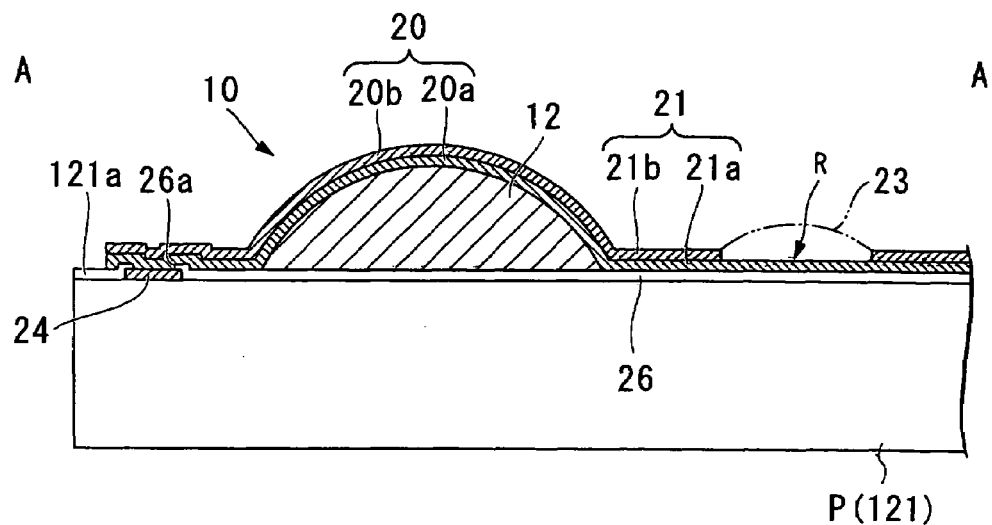
FIG. 4B is a cross-sectional view a terminal portion of a semiconductor device taken along the line A-A in FIG. 4.

FIG. 4A and 4B show the configuration of principal portions of bump electrodes 10. FIG. 4A is an enlarged plan view of the vicinity of a bump electrode, and FIG. 4B is a cross-sectional view taken along the line A-A in FIG. 4.

As shown in FIG. 4A, on the outer periphery of the active face 121a of the semiconductor device 121, a plurality of electrode pads 24 made of Al or another conductive material is formed in an arrangement.

Moreover, a passivation film 26 made of SiN or another electrically insulating material is formed, as a protective film, over the entire active face 121a of the semiconductor device 121.

Aperture portions 26a are formed in the passivation film 26 at the surfaces of each of the above-described electrode pads 24.

An organic resin film made of a polyimide or the like with high stress relaxation properties is formed on either the entirety of or on a portion of the passivation film 26, excluding the aperture portions 26a.

The resin protrusions 12 are formed on the surface of the passivation film 26.

As shown in FIG. 3, the resin protrusions 12 are formed on the inside of the positions of formation of the electrode pad rows 24a on the active face 121a.

The resin protrusions 12 are formed protruding in the perpendicular direction from the active face 121a of the semiconductor device 121, and extend in a straight-line shape at substantially the same height, positioned parallel to the electrode pad rows 24a.

The resin protrusions 12 include a resin material having elasticity, such as a polyimide resin, acrylic resin, phenolic resin, epoxy resin, silicone resin, denatured polyimide resin, or the like, and are formed using, for example, an inkjet method.

It is preferable that the cross-sectional shape of the resin protrusions 12 be a shape which easily undergoes elastic deformation, such as a semicircular shape or a trapezoidal shape, as shown in FIG. 4B.

By this means, when the semiconductor device 121 is brought into contact on the substrate P onto which the semiconductor device 121 is packaged, the bump electrodes 10 can easily be elastically deformed.

Hence the reliability of the electrically conducting connection of the semiconductor device 121 on the substrate onto which the semiconductor device 121 is packaged can be enhanced.

Furthermore, among the plurality of electrode pads 24 forming the electrode pad rows 24a, two electrode pads 24 are electrically connected by a conductive film formed in a U-shape.

Here, the conductive film formed in a U-shape includes a conductive film 20 (wiring pattern) and a conductive film 21 (wiring pattern).

Furthermore, the conductive film 20 is formed on the surface of the resin protrusions 12 so as to span the resin protrusions 12, from the surfaces of each of the electrode pads 24 in the direction connecting the top of the resin protrusions 12.

The conductive film 21 is formed on the end portion of the conductive film 20 on the side opposite the electrode pads 24, spanning the resin protrusions 12.

The conductive film 21 is formed in the direction which perpendicularly intersects the direction of extension of the conductive film 20.

By this means, adjacent conductive films 20 are electrically connected by the conductive films 21, and U-shaped conductive films are formed.

Each of the conductive films 20 and 21 has a two-layer wiring structure, including a conductive film (first wiring pattern) 20a and 21a positioned as the lower layer, and a conductive film (second wiring pattern) 20b and 21b placed on top of the conductive films 20a and 21a.

In this embodiment, the conductive films 20a and 21a are made of TiW and have a thickness of 3000 to 7000 Å (in this embodiment, 3000 Å), and the conductive films 20b and 21b are made of Au, have resistance value greater than that of the conductive films 20a and 21a, *and a thickness of* 1000 to 5000 Å (in this embodiment, 1000 Å). All films are formed by sputtering.

In the conductive films 21, a portion of the conductive film 21b is removed to expose the conductive film 21a, to form a resistance element R (electronic element).

The material properties and film composition adopted for each conductive film, and the area of the resistance portion, can be modified appropriately according to the desired resistance value.

Below, the two-layer conductive film configuration of this embodiment is explained, however three or more layers may be combined in a conductive film according to the desired resistance value and temperature characteristics.

Furthermore, in addition to sputtering, such well-known methods as vacuum evaporation and plating may be used to form conductive film.

As indicated in FIG. 1 above, the bump electrodes 10 are thermal compression bonded onto the terminals 111bx on the substrate 111 with the sealing resin 122 intervening.

The sealing resin 122 is a thermo-curable resin, and prior to packaging is in an uncured or semi-cured state.

If the sealing resin 122 is in an uncured state, the resin may be applied to the active face of the semiconductor device 121 (the surface faces the substrate extended portion 111T) or onto the substrate 111 prior to packaging. If the sealing resin 122 is in a semi-cured state, the resin may be inserted between the semiconductor device 121 and substrate 111 as a film or in sheet form.

As the sealing resin 122, epoxy resin is generally used, not only the epoxy resin but also other resins may be employed.

The process of packaging of the semiconductor device 121 is performed by using a thermo-compression head or the like to press the semiconductor device 121 against the substrate 111 while applying heat.

At this time, the sealing resin 122 is softened by heating in the initial period, and by pressing aside the softened resin, the tops of the bump electrodes 10 are brought into electrically conductive contact with the terminals 111bx.

In addition, the applied pressure causes the resin protrusions 12, which are resin in the interior, the resin protrusions 12 is depressed and undergo elastic deformation in the contact direction (the vertical direction of the semiconductor device 121 in FIG. 4B).

When heat is applied continuously in this state, bridging and thermo-curing of the sealing resin 122 occurs, so that even when the pressing force is released, the sealing resin 122 causes the bump electrodes 10 to be in electrically conductive contact with the terminals 111bx while maintaining the elastically deformed state.

Manufacturing Method for Semiconductor Device

Next, the process of forming the above bump electrodes 10 in particular in the manufacturing method for a semiconductor device is explained.

FIGS. 5A to 7E are cross-sectional views explaining a manufacturing method for a semiconductor device, and are process diagrams which illustrate an example of a manufacturing method for a semiconductor device 121.

The manufacturing processes of the semiconductor device 121 include a process to form a passivation film 26, a process to form resin protrusions 12, and a process to form conductive films 20 and 21.

In this embodiment, an inkjet method is used to form the resin protrusions 12.

Figure 5A:
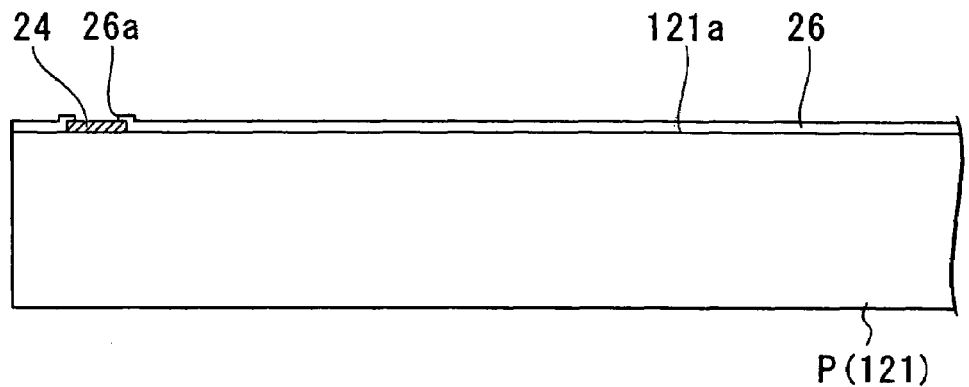
FIGS. 5A to 5C are views explaining a manufacturing method for a semiconductor device.

First, as shown in FIG. 5A, the passivation film 26 is formed on the active face 121a of the substrate P on which semiconductor elements are formed.

Specifically, after using a film deposition method to form a passivation film 26 made of $SiO_2$, SiN, or the like, on the substrate P, a photolithography method is used to perform patterning, to form aperture portions 26a exposing the electrode pads 24.

The forming method for aperture portions 26a is explained.

First, a resist layer is formed on the passivation film 26 by a spin-coating method, dipping method, spray-coating method, or the like.

Next, a mask on which a prescribed pattern is formed is used to perform exposure and development of the resist layer, to form a resist pattern with a prescribed shape.

Thereafter, etching of the film is performed using the resist pattern as a mask, to form the aperture portions 26a exposing the electrode pads 24, a stripping liquid or the like is then used to remove the resist pattern.

As the etching method, it is preferable that a dry etching method be used, and reactive ion etching (RIE) is suitable for use as the dry etching method.

However, wet etching may also be used for etching.

On the passivation film 26, photolithography or another method may be used to form a polyimide or other organic resin film with high stress relaxation properties, on all of or a portion of the surface excluding the aperture portions.

Thus, the resistance elements R formed by the method described below may be formed on an organic resin film (insulating film).

Figure 5B:
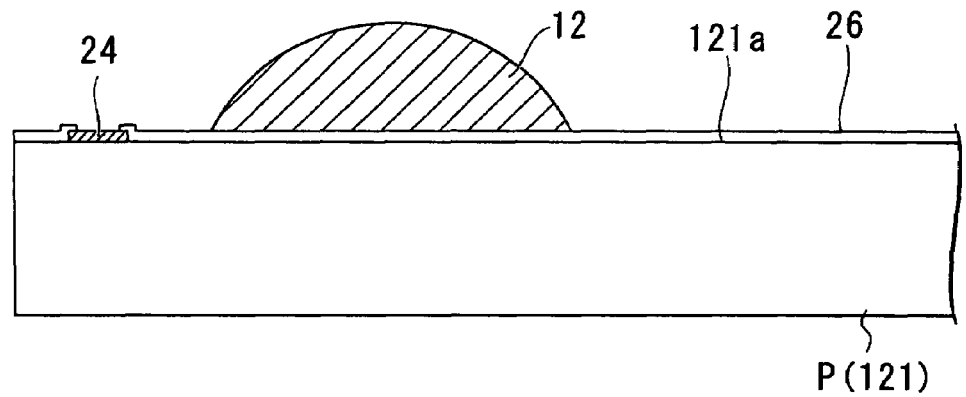

Next, as shown in FIG. 5B, an inkjet method (liquid droplet ejecting method) is used to form resin protrusions 12 on the active face 121a of the substrate P, on which electrode pads 24 and a passivation film 26 have been formed.

In this inkjet method, a liquid ejection head is faced to the substrate W, and a droplet is ejected from a nozzle provided on the liquid ejection head to the substrate W.

Specifically, in this inkjet method, a film pattern made of resin material and shaped predetermined formation is formed on the substrate P, while ejecting (dripping) resin material (liquid material) as the droplet, and while moving the liquid ejection head relative to the substrate W.

Then, by heat-treating this film pattern, the resin protrusions 12 are obtained.

Here, by ejecting a plurality of liquid droplets from the liquid ejection head and positioning the resin material, film made of the resin material can be formed in an arbitrary shape, and the resin protrusions 12 can be made thick through layering of the resin material.

For example, by repeating a process of placing resin material on the substrate P and a process of drying the resin material, dried films of resin material can be layered to reliably form the resin protrusions 12 as a thick film.

By ejecting liquid droplets containing resin material from a plurality of nozzles provided on the liquid ejection head, the placement of resin material and the timing of resin placement can be controlled for each portion.

Furthermore, by using photolithography methods or the like to form resin protrusions 12, and melting the resin protrusions 12 at the time of curing to cause the melted resin in the vicinity of the resin protrusions 12 to flow, a desired shape for the resin protrusions 12 may be obtained.

Figure 5C:
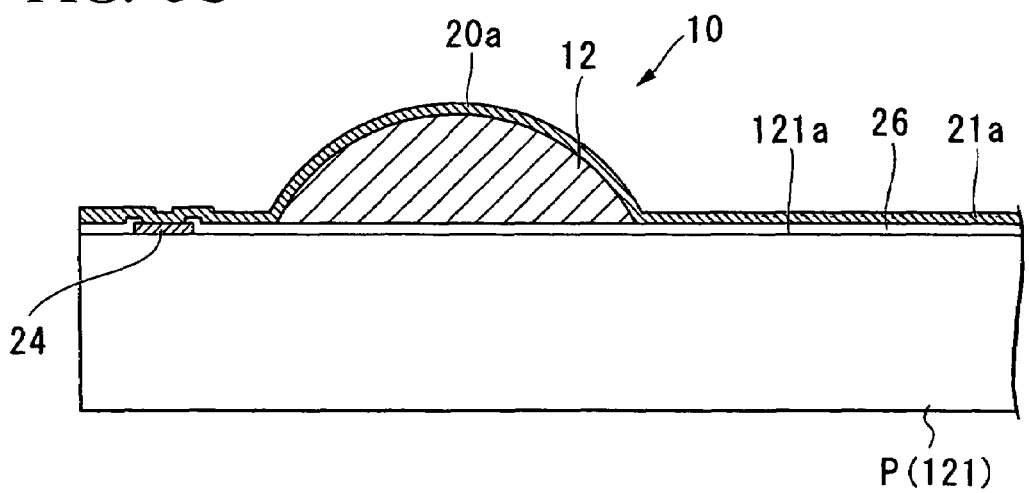

Next, as shown in FIG. 5C, conductive films 20a and 21a are formed, as metal wiring, from the surfaces of the electrode pads 24 to the surfaces of the resin protrusions 12, to cover the electrode pads 24 and the tops of the resin protrusions 12.

Here, these conductive films 20a and 21a are not patterned, but are deposited as films covering the entirety of the electrode pads 24, resin protrusions 12, and passivation film 26.

Figure 6A:
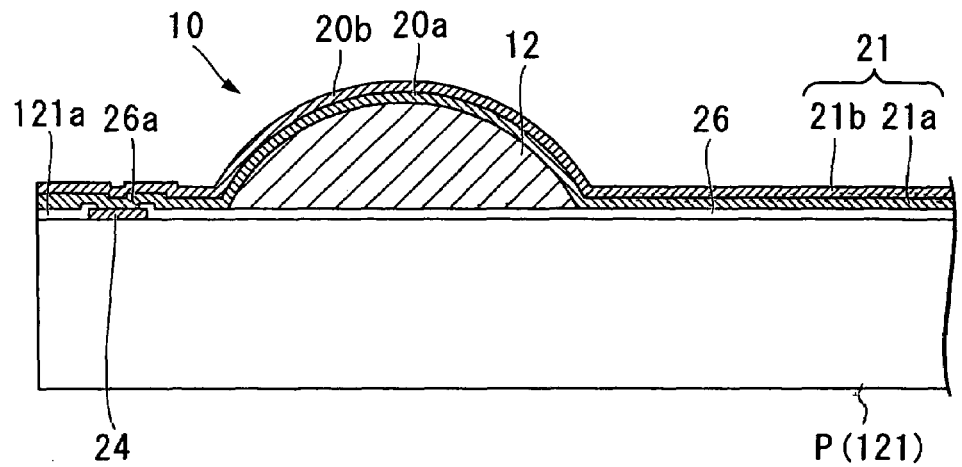
FIGS. 6A to 6C are views explaining a manufacturing method for a semiconductor device.

Next, as shown in FIG. 6A, sputtering is performed to deposit conductive films 20b and 21b on the conductive films 20a and 21a.

These conductive films 20b and 21b likewise are not patterned, but are deposited as films covering the entirety of the conductive films 20a and 21a.

Thereafter, similar to the method used to form the passivation film 26, photolithography is used in patterning, to form the conductive films 20b and 21b into the shapes shown in FIGS. 3, 4A, and 4B.

Specifically, a resist layer is formed on the conductive films 20b and 21b by spin-coating, dipping, spray-coating or another method, and a mask on which a prescribed pattern has been formed is used in exposure and development of the resist layer, to form a resist pattern of a prescribed shape (a pattern with apertures in areas other than the prescribed wiring pattern).

Then, the resist pattern is used as a mask to etch the films, and a prescribed stripping liquid or the like is used to remove the resist pattern, to obtain conductive films 20b and 21b with the prescribed shapes.

Figure 6B:
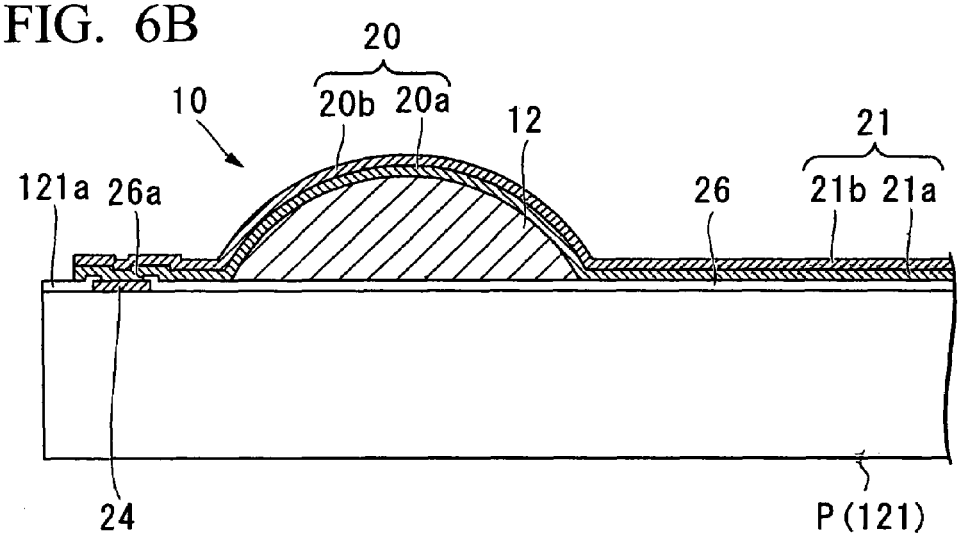

Next, as shown in FIG. 6B, the patterned conductive films 20b and 21b are used as masks to perform etching, to pattern the conductive films 20a and 21a into the same shapes as the conductive films 20b and 21b, forming conductive films 20 and 21 consisting of two layers.

Then, to form a resistance element R, a resin film 22 as a mask is affixed to the conductive films 20 and 21 on the substrate P. The mask has an aperture portion 22a corresponding to the shape and position of the resistance element R.

In areas on which conductive films 20 and 21 are not formed, the resin film 22 is affixed on the passivation film 26.

Figure 7A:
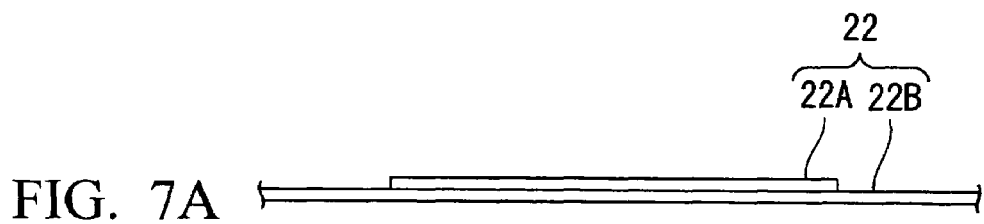
FIGS. 7A to 7E are views explaining a manufacturing method for a semiconductor device.

As indicated in FIG. 7A, this resin film 22 includes a mask film 22A (first film member) and a base film 22B (second film member). The mask film 22A is affixed on the substrate P and has an external shape substantially the same as that of the substrate P. The base film 22B is laminated on mask film 22A, is formed into a strip shape (continuous tape shape) of the length of a plurality of mask films 22A affixed in a manner enabling peeling at prescribed intervals.

The mask films 22A are, for example, made of dry film which is resistant to an etching agent (etching liquid) described below and has self-adhesive properties, and are bonded to the base film 22B integrally with a peeling agent intervening.

As this peeling agent, material which peels upon UV irradiation or material which peels upon application of heat, is used.

The left end of the base film 22B is drawn from a roll (not shown), and the right end of the base film 22B is taken up by a take-up reel (not shown). The base film 22B moves in the length direction according to rotation of the reel.

Figure 7B:
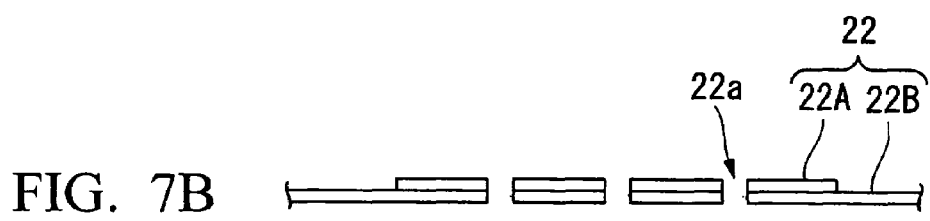

In order to form resistance elements R using this resin film 22, first, die-cutting with a die is used to form an aperture portion 22a which penetrates the resin film 22 (mask film 22A and base film 22B) corresponding to the shape and position of the resistance element R, as shown in FIG. 7B.

In this way, aperture portions 22a in the mask for etching described below are formed by die-cutting with a die.

Hence, in this method, it is possible to realize superior productivity than a method in which an etching mask is formed on the semiconductor device by using a photolithography process.

The forming method for the aperture portions 22a is not limited to die-cutting with a die, for example, a method of casting using a die prepared having holes, or a method of machining aperture portions 22a using a chemical etching method, or the like may be used.

Figure 7C:
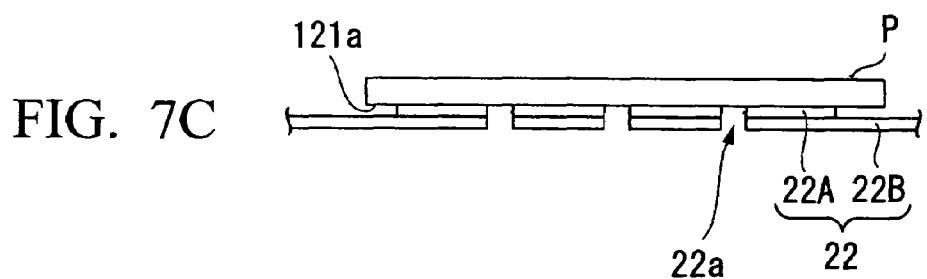

Next, as shown in FIG. 7C, the mask film 22A is oriented to face the active face 121a of the substrate P, and the resin film 22 is positioned and affixed on the substrate P.

Figure 6C:
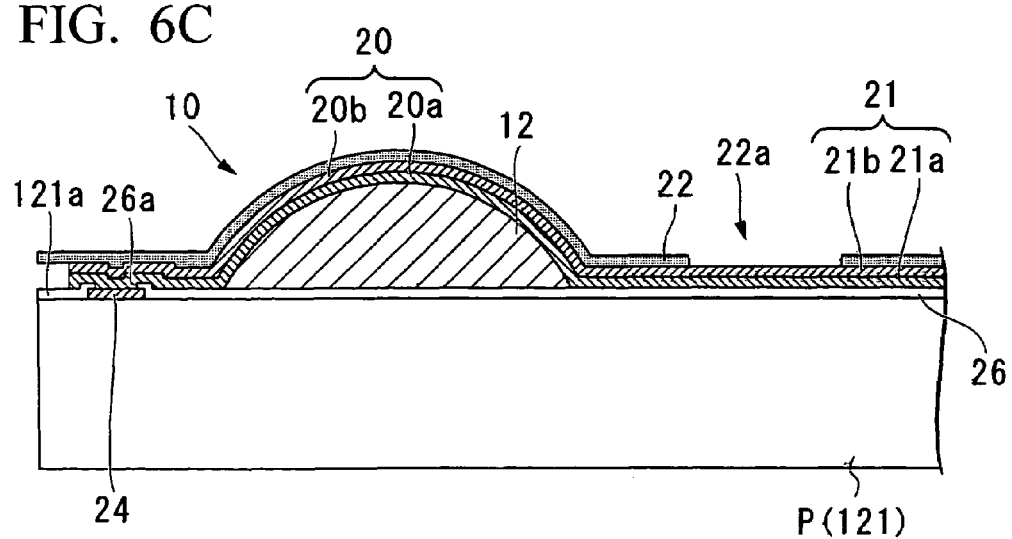

In FIGS. 7A to 7E, the substrate P is shown with the top and bottom reversed relative to FIGS. 4B, 5, and 6.

The figures omit protrusions and depressions in the active face 121a.

When affixing the resin film 22 (mask film 22A) to the substrate P, it is preferable that the affixing of the resin film 22 be performed in a negative-pressure environment (vacuum laminate affixing) in order that air bubbles do not remain between the mask film 22A and the substrate P.

Furthermore, when the mask film 22A and the base film 22B are bonded using a heat-peeling agent, it is preferable that the resin film 22 be affixed on the substrate P in a state of applied heat and pressure, in order to increase the bonding force between the substrate P (conductive film) and the base film 22B.

Figure 7D:
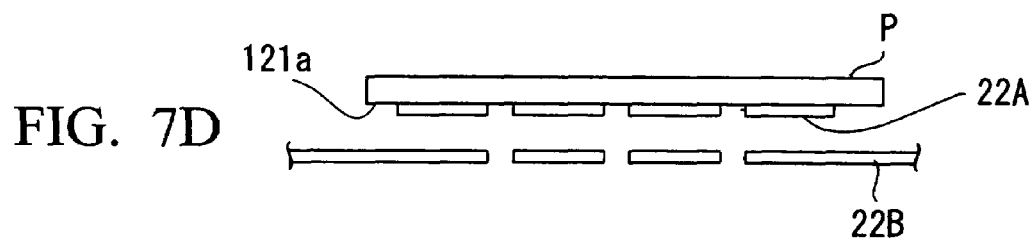

Then, film stripping treatment is performed, through heating, UV irradiation, or the like, and as shown in FIG. 7D, the base film 22B is peeled from the mask film 22A which has been affixed on the substrate P.

Figure 7E:
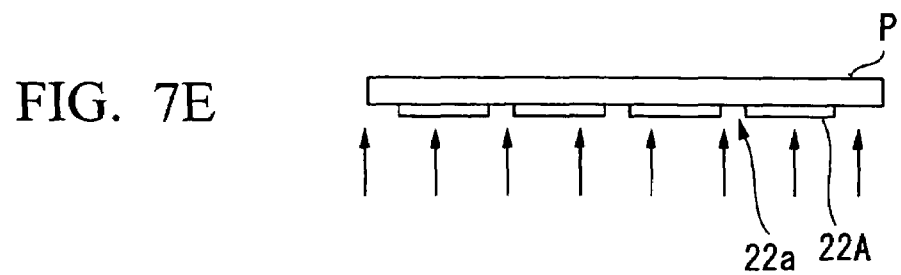

Then, as shown in FIG. 7E, etching of the substrate P is performed using the mask film 22A as a mask, so that only the conductive film 21b exposed via the aperture portions 22A is selectively removed by etching, to expose the conductive film 21a.

As the etching liquid, for example, ferric chloride, ammonium persulfate, or the like is used.

Thereafter, by removing the mask film 22A using stripping liquid or the like, resistance elements R with a high resistance value, in which a portion of the conductive film 21 consists only of the conductive film 21a, are formed, as shown in FIG. 4A and FIG. 4B.

As the stripping liquid, for example, sodium carbonate or another alkaline solution can be used.

The material properties, film thickness, and area of a resistance element R can be adjusted according to the resistance value required.

When the width of TiW forming the conductive films 20a and 21a is 1000 Å, the resistance value is approximately $7 \times 10^{-2}$ $\Omega/\mu m^2$.

When the thickness of Au forming the conductive films 20b and 21b is 3000 Å, the resistance value is approximately $2 \times 10^{-4}$ $\Omega/\mu m^2$.

Hence when a resistance element R with a resistance value of 70 Ω is required, the resistance element R may be formed with, for example, a width of 10 μm and length of 100 μm, with the conductive films 20b and 21b removed.

At this time, the resistance of the conductive films 20a and 21a positioned in the lower layers is greater than the resistance values of the conductive films 20b and 21b positioned in the upper layers, so that a higher resistance value can easily be obtained.

By modifying the thickness of the conductive films or the area of the resistance element R, a resistance element R of for example 50 Ω, which is widely adopted as a terminating resistance value, can be easily formed.

Thereafter, as indicated by the double chain line in FIG. 4B, a sealing film 23 can be formed by covering the resistance value R with a solder resist or other resist material (sealing member).

By this means, the humidity resistance and other properties of the resistance element R can be improved.

It is preferable that this protective film 23 (sealing film) be formed so as to cover at least the resistance element R, the film can be formed by, for example, a photolithography method, liquid droplet dispensing method, printing method, dispensing method, or the like.

As explained above, in this embodiment, by etching the substrate P using a mask film 22A having aperture portions 22a corresponding to resistance elements R, resistance elements R can be formed without employing photo-processes, so that increases in manufacturing cost can be suppressed.

Furthermore, in this embodiment, die-cutting is used to form the aperture portions 22a, so that aperture portions 22a can be formed easily and with high precision.

Furthermore, the mask film 22A in which are formed aperture portions 22a with the same precision can be formed in large quantities at low cost.

As a result, by means of this embodiment substrates P having precise resistance elements R can be manufactured uniformly and in large quantities.

Moreover, because no photo-processes are used, damage sustained in optical, thermal, development, and other processes can be reduced as well.

In this embodiment, the base film 22B is formed into a strip shape (tape shape), and can be moved by means of a reel, so that by repeating in succession the intermittent movement of the base film 22B (which is stopped during the affixing of the film, and moved after the affixing of the film is completed) and affixing of the mask film 22A, mask film 22A can be continuously affixed with a plurality of substrates P.

As a result, productivity can be improved.

Furthermore, in this embodiment the mask film 22A is affixed on the substrates P in a negative-pressure environment, so that problems in which intrusion of air bubbles between the mask film 22A and substrate P, giving rise to faults in affixing the mask film 22A, seepage of the etching agent and reduced production yields, can be avoided.

In particular, in this embodiment heat and pressure can be applied at the time the mask film 22A is affixed to enhance adhesion of the mask film 22A to the substrate P.

By this means, the quality of the semiconductor device 121 can be maintained.

Furthermore, in this embodiment, by forming a portion of the conductive film 21 to be thin, a single-layer portion including the conductive film 21a is formed, to form a resistance element R.

Hence there is no need to package new resistance members or the like, and resistance portions can easily be formed.

In this embodiment, resistance elements R can easily be formed in the vicinity of semiconductor elements via electrode pads 24, so that the electrical path from a semiconductor element to a resistance element R can be made as short as possible, and excess wiring can be minimized.

As a result, parasitic capacitances due to wiring, stubs or the like can be kept to a minimum.

In particular, electrical characteristics in the high-frequency range (losses, noise radiation) can be improved.

Furthermore, in this embodiment a resistance value can be adjust through the material forming the resistance element R and the area of the resistance element R, so that a desired resistance value can be secured with high precision.

The reliability of the semiconductor device (electronic substrate) 121 can be improved.

In particular, in this embodiment the conductive films 20 and 21 are formed by means of methods with excellent film composition control, thickness precision and other dimensional precision, such as sputtering, plating, and photolithography methods, so that the resistance value of a resistance element R can be controlled and managed with high precision.

In this embodiment, a resistance element R is formed by removing the conductive film 21b among the two-layer structure conductive film 21, so that by appropriately selecting the etching liquid according to the material of the conductive film 21b which is positioned as the upper layer, a resistance element R can easily be formed.

In particular, in this embodiment the conductive film 21a positioned as the lower layer has a higher resistance than the conductive film 21*b* in the upper layer, so that a higher resistance value can easily be obtained.

Thus, in this embodiment, by selecting film types, or by selecting which conductive film layer to use as the conductive film among a plurality of conductive films in a layered structure according to the resistance required, the range of resistance values and current tolerance values which can be selected during design can be improved.

These remarks apply similarly to structures of three layers or more.

Electronic Device

Next, electronic device including the above-described electro-optical device or semiconductor device is explained.

Figure 8:
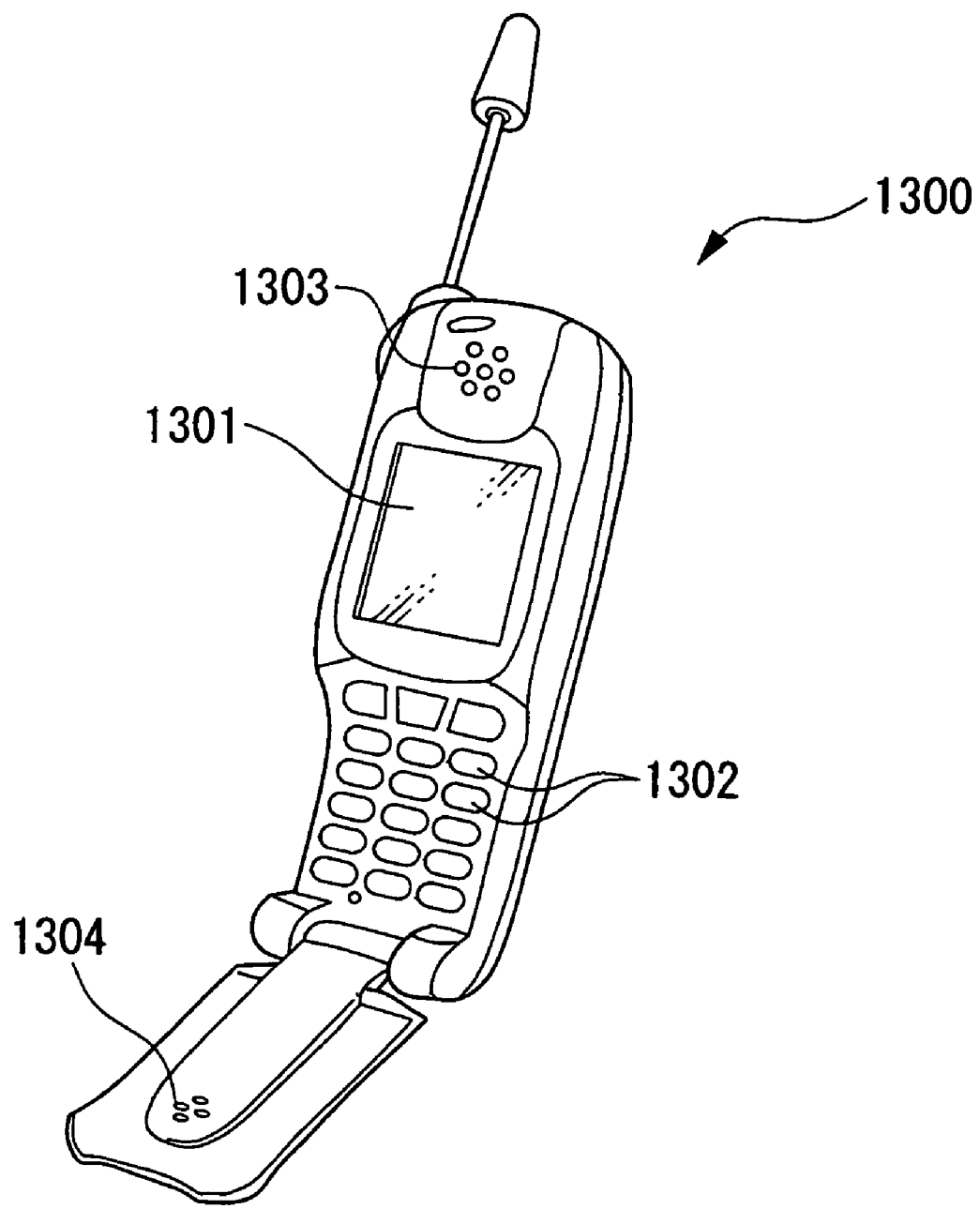
FIG. 8 is a perspective view showing an example of electronic device.

FIG. 8 is a perspective view showing an example of electronic device of this invention.

The portable telephone 1300 shown in this drawing includes the above-described electro-optical device as a small-size display portion 1301, and further includes a plurality of operating buttons 1302, a telephone receiver 1303, and a telephone transmitter 1304.

The above-described electro-optical device can be used as appropriate image display means not only in the above portable telephone, but in an electronic book, personal computer, digital still camera, liquid crystal television, camcorder with viewfinder or direct-view display, car navigation system, pager, electronic organizer, electronic calculator, word processor, workstation, video telephone set, POS terminal, and various equipment including a touch screen display; in all of these cases, high-quality electronic device, in which precise resistance values have been secured, can be provided.

In the above, preferred embodiments of the invention have been explained referring to the attached drawings, but the invention is not limited to these examples.

The shapes, combinations and similarity of the constituent members described in the above examples are merely examples, and various modifications can be made without deviating from the gist of the invention, based on design requirements or the like.

For example, in the above embodiments, a configuration was explained in which a mask film 22A is removed, but removal is not necessarily required, and the mask film 22A may be left on the substrate P.

Furthermore, in the above embodiments a configuration was described in which a resistance element R is formed in a conductive film 21, but configurations are also possible in which resistance elements R are formed in the conductive film 20.

Furthermore, in the above embodiments a configuration was explained in which adjacent conductive films 20 are connected by a conductive film 21, but configurations are also possible in which a resistance element is provided in a portion of a relocated wiring layer serving as an external connection terminal.

In the above embodiments, a configuration was described in which, by removing one layer among a two-layer-structure electrode film 21, a resistance element R is formed, but other configurations are possible, and application is possible even for single-layer-structure electrode films and electrode films with three or more layers.

For example, in the case of an electrode film with a single-layer structure, by for example adjusting the etching time, the thickness of the resistance portion can be adjusted to be thinner than the thickness of other areas, so that a desired resistance value is obtained.

As an electrode film with a three-layer structure, for example, a configuration may be adopted in which after forming TiW—Cu by sputtering, plating is used to layer Cu.

Moreover, an electrode film formed by Cu plating can be removed and sputtering used to form a resistance element of TiW—Cu or an electrode film of Cu (sputtering)-Cu (plating) removed, to form a resistance element of a TiW electrode film alone.

Furthermore, in a two-layer-structure electrode film also, a portion of the upper-layer conductive film 21*b* may be left in the thickness direction, and the remaining conductive film 21*b* and the lower-layer conductive film 21*a* used to form the resistance element.

Furthermore, after removing the conductive film 21*b*, etching of the conductive film 21*a* may be performed, to form a resistance element having a higher resistance value by means of a thinner conductive film 21*a*.

In all these cases, by partially removing conductive film according to the desired resistance value, a resistance element having the resistance value can easily be formed.

Furthermore, the forming method for the resistance element is not limited to removal of conductive film in the thickness direction.

By making the width of a portion of the conductive film (wiring pattern) narrower than that of other portions, resistance elements with a planar pattern may be formed.

Figure 9A:
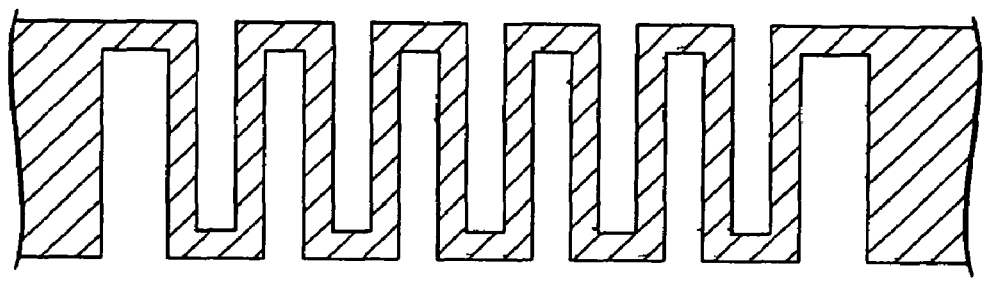
FIGS. 9A and 9B are plan views showing a modified example of a resistance element.

For example, as shown in FIG. 9A, by using wiring having a line width which is narrower than that in other places, a U-shape is repeated to form a winding-shaped or meandering-shaped electrode film, to realize a resistance element with a high resistance value.

Figure 9B:
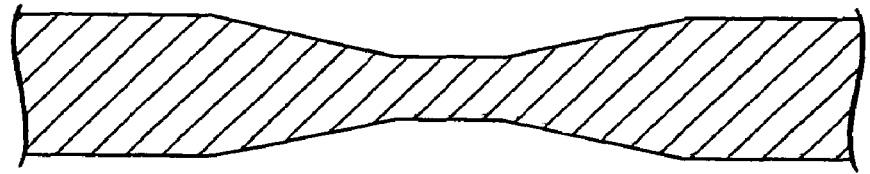

In addition, as shown in FIG. 9B, a narrowed (constricted) portion with high resistance may be formed, to realize a resistance element with a high resistance value.

In the above embodiments, by adjusting the thickness and width of conductive film, the resistance value of the resistance element is adjusted.

Figure 10:
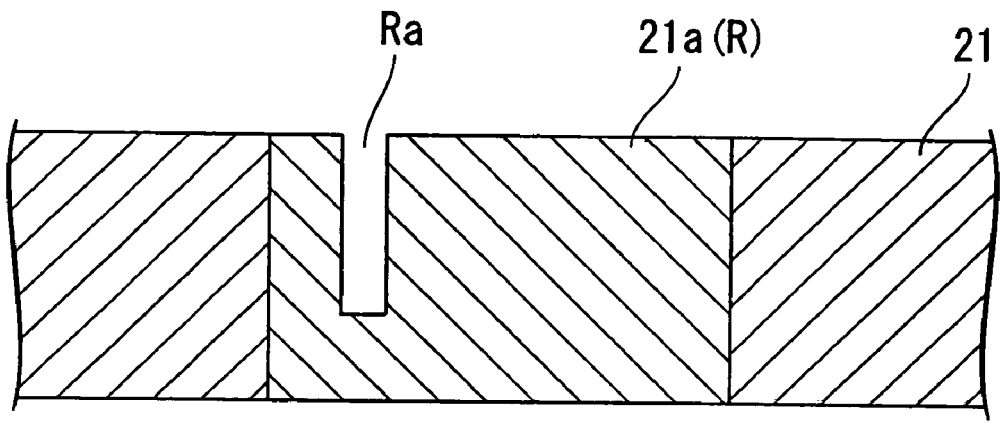
FIG. 10 is a plan view explaining a fine adjusting method for a resistance value.

However, other configurations are possible, for example, as shown in FIG. 10, the conductive film 21*a* may be exposed in a portion of the conductive film 21 to form a resistance element R, and laser light or the like may be used to trim this resistance element R, to form a cutout portion Ra in which a portion of the conductive film 21*a* has been cut out (removed).

In this case, by adjusting the size of the cutout portion Ra (thus, the size of the connecting the conductive film 21*a*), fine adjustment of the resistance value is possible.

Hence a high-precision resistance element can easily be formed.

In particular, in the above embodiment the resistance element R is placed near the surface of the semiconductor device 121, so that fine adjustment of the resistance value can easily be performed.

Furthermore, the materials of the conductive film (resistance element) in the above embodiments are examples, but in addition, for example Ag, Ni, Pd, Al, Cr, Ti, W, NiV, as well as lead-free solder, and other conductive materials may be used.

In these cases also, when using a plurality of materials to form conductive film with a layered structure, it is preferable that material be selected for conductive film positioned in lower layers which has a larger resistance value than conductive film positioned in upper layers.

Depending on the combination of materials selected, not only can the desired resistance value be simply obtained, but, for example, focusing on the resistance-temperature characteristics of the materials, it is possible to obtain a desired resistance-temperature characteristic through an appropriate combination of materials.

Furthermore, the above-described conductive films 20 and 21 in the above embodiments are formed using sputtering and plating methods; but inkjet methods may be used as well.

In the above embodiments, cases were explained in which the electronic substrate has semiconductor elements; but as the electronic substrate of this invention, semiconductor elements need not necessarily be provided.

For example, substrates include silicon substrates, glass substrates, ceramic substrates, organic substrates, and film substrates in an unpackaged stated, with no external devices packaged in the packaging area (active area) for semiconductor chips and other external devices.

In this case, a configuration is possible in which an electronic substrate of this invention is connected via bump electrodes to a circuit substrate or the like having semiconductor elements.

Furthermore, other electronic circuits may be incorporated into these substrates.

Furthermore, these may be liquid crystal panels, plasma displays, crystal oscillators, or other electronic devices.

Furthermore, resistance elements formed in these embodiments are formed using a portion of wiring, and so connection to electrodes of the electronic substrate is not necessary.

A resistance element may be used to connect two electrodes, and need not be connected to an external electrode or to an external terminal.

Furthermore, this invention can be applied to all electronic device which employs multilayer wiring.

For example, application is also possible to wiring patterns in which conductive films having characteristics exhibiting relations which are opposite with respect to changes in resistance value with changes in temperature are layered.

Figure 11:
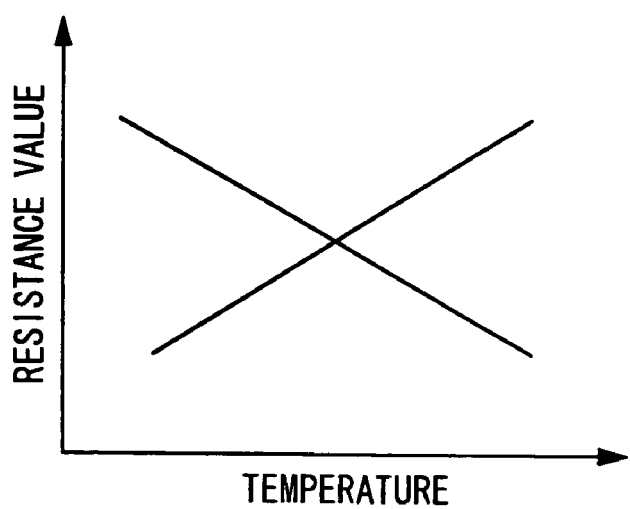
FIG. 11 is a diagram showing the relation between temperature and resistance value.

For example, as shown in FIG. 11, by layering a conductive film formed from a material (for example $RuO_2$) having a characteristic in which the resistance value increases with rising temperature, and a conductive film formed from a material (for example $Ta_2N$) having a characteristic in which the resistance value falls with rising temperature, application is also possible to a wiring pattern in which temperature drift can be cancelled.

What is claimed is:

1. A manufacturing method for an electronic substrate, comprising:
   preparing a substrate and a mask having a predetermined region;
   forming a wiring pattern on the substrate;
   forming an aperture portion in the predetermined region of the mask;
   affixing the mask on the substrate; and
   removing at least a part of the wiring pattern through the aperture portion of the mask thereby forming the electronic element on the substrate,
   wherein the mask has a first film member that is to be affixed to the substrate, and a second film member that is peelably laminated on the first film member.

2. The manufacturing method for an electronic substrate according to claim 1, wherein the forming of the aperture portion includes die-cutting the mask.

3. The manufacturing method for an electronic substrate according to claim 1, wherein the affixing of the mask is performed affixing the mask on the substrate in a negative-pressure environment.

4. The manufacturing method for an electronic substrate according to claim 1, wherein the affixing of the mask is performed affixing the mask on the substrate while heating the mask and pressuring the mask into the substrate.

5. The manufacturing method for an electronic substrate according to claim 1, further comprising:
   sealing the electronic element by a sealing member.

6. The manufacturing method for an electronic substrate according to claim 1, wherein the substrate includes a semiconductor element.

7. The manufacturing method for an electronic substrate according to claim 1, wherein no semiconductor element is packaged on the substrate.

8. The manufacturing method for an electronic substrate according to claim 1, further comprising:
   forming an insulating film on which the wiring pattern is formed, formed on the substrate.

9. The manufacturing method for an electronic substrate according to claim 1, further comprising:
   forming an electrode portion connected with the wiring pattern, wherein the wiring pattern includes a terminal at which at least a portion of the wiring pattern is connected to an external terminal.

10. A manufacturing method for an electro-optical device, comprising:
    manufacturing the electronic substrate by the manufacturing method for an electronic substrate according to claim 1.

11. A manufacturing method for electronic device, comprising:
    manufacturing the electronic substrate by the manufacturing method for an electronic substrate according to claim 1.

12. The manufacturing method for an electronic substrate according to claim 1, wherein the first film member is formed to a size according to the size of the substrate, the second film member is formed into a strip shape, and a plurality of the first film members are laminated onto the second film member in the direction of extension of the strip-shaped second film member.

13. The manufacturing method for an electronic substrate according to claim 12, wherein the affixing of the mask is performed affixing in order the first film members on the substrate, while intermittently moving the second film member in the direction of extension of the strip-shaped second film member.

14. The manufacturing method for an electronic substrate according to claim 1, wherein the removing of at least a part the wiring pattern is performed removing a portion of the wiring pattern of the substrate thereby forming a resistance element as the electronic element.

15. The manufacturing method for an electronic substrate according to claim 14, wherein the wiring pattern of the substrate has wiring layers which are at least two layers, and a number of layers of the resistance element is fewer than that of the wiring layers of the wiring pattern.

16. The manufacturing method for an electronic substrate according to claim 15, wherein the forming of the wiring pattern includes:

forming a first wiring pattern on the substrate; and forming a second wiring pattern layered on top of the first wiring pattern and made of a material differed from that of the first wiring pattern, and wherein a portion of the second wiring pattern is removed through the aperture portion of the mask.

17. The manufacturing method for an electronic substrate according to claim 16, wherein a resistance value of the material of the first wiring pattern is larger than that of the second wiring pattern.

18. The manufacturing method for an electronic substrate according to claim 1, further comprising:

forming an electrode portion; and connecting the electrode portion with the wiring pattern.

19. The manufacturing method for an electronic substrate according to claim 18, wherein at least a portion of the wiring pattern has a connection terminal.

\* \* \* \* \*